United States Patent
Heiman et al.

(10) Patent No.: US 8,295,362 B2
(45) Date of Patent: Oct. 23, 2012

(54) METHOD AND SYSTEM FOR REDUNDANCY-BASED DECODING OF VIDEO CONTENT

(75) Inventors: Arie Heiman, Rannana (IL); Jeyhan Karaoguz, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1622 days.

(21) Appl. No.: 11/686,882

(22) Filed: Mar. 15, 2007

(65) Prior Publication Data

US 2008/0225163 A1  Sep. 18, 2008

Related U.S. Application Data

(63) Continuation-in-part of application No. 11/325,751, filed on Jan. 5, 2006.

(51) Int. Cl.
*H04N 7/12* (2006.01)
*H04N 11/02* (2006.01)
*H04L 27/06* (2006.01)
*G06K 9/46* (2006.01)
*H04N 7/26* (2006.01)
*H04L 1/00* (2006.01)

(52) U.S. Cl. .............. 375/240.25; 375/240.13; 375/340; 382/250

(58) Field of Classification Search ............. 375/240.25, 375/340, 240.13; 382/250
See application file for complete search history.

(56) References Cited

U.S. PATENT DOCUMENTS

2004/0151394 A1* 8/2004 Soderberg et al. ............ 382/250
2007/0153942 A1* 7/2007 Zeng et al. .................... 375/340

FOREIGN PATENT DOCUMENTS

JP   2012019540 A  *  1/2012

OTHER PUBLICATIONS

Minjoong Rim; Young-Uk Oh; Memory management in high-speed Viterbi decoders'; VLSI Signal Processing, VIII, 1995. IEEE Signal Processing Society; Digital Object Identifier: 10.1109/VLSISP.1995. 527522; Publication Year: Jan. 1995, pp. 511-520.*

* cited by examiner

*Primary Examiner* — Eleni Shiferaw
*Assistant Examiner* — Courtney Fields
(74) *Attorney, Agent, or Firm* — Sterne, Kessler, Goldstein and Fox P.L.L.C.

(57) ABSTRACT

Aspects of a method and system for redundancy-based decoding of video content are provided. A bit sequence comprising video content may be decoded in a multilayer process based on a decoding algorithm and at least one physical constraint. The decoding algorithm may be based on the Viterbi algorithm. Whether the bit sequence comprises video content may be determined based on information provided by a portion of a packet header or by packet priority information necessary for enabling quality of service applications. The physical constraint may be based on border, DC component, and/or low frequency continuity between neighboring discrete cosine transform (DCT) blocks. The physical constraint may also be based on the consistency of video data coded by a variable length coding (VLC) operation. At least one physical constraint test may be performed on selected estimated video bit sequences to select a decoded output video bit sequence.

21 Claims, 11 Drawing Sheets

METHOD AND SYSTEM FOR REDUNDANCY-BASED DECODING OF VIDEO CONTENT

CROSS-REFERENCE TO RELATED APPLICATIONS/INCORPORATION BY REFERENCE

This patent application is a continuation-in-part of U.S. patent application Ser. No. 11/325,751 filed on Jan. 5, 2006.

This patent application makes reference to:
U.S. patent application Ser. No. 11/189,509 filed on Jul. 26, 2005;
U.S. patent application Ser. No. 11/189,634 filed on Jul. 26, 2005; and
U.S. patent application Ser. No. 11/686,876 filed on Mar. 15, 2007,
which are herein incorporated by reference in their entirety.

FIELD OF THE INVENTION

Certain embodiments of the invention relate to handling of video signals. More specifically, certain embodiments of the invention relate to a method and system for redundancy-based decoding of video content.

BACKGROUND OF THE INVENTION

In some conventional receivers, improvements may require extensive system modifications that may be very costly and, in some cases, may even be impractical. Determining the right approach to achieve design improvements may depend on the optimization of a receiver system to a particular modulation type and/or to the various kinds of noises that may be introduced by a transmission channel. For example, the optimization of a receiver system may be based on whether the signals being received, generally in the form of successive symbols or information bits, are interdependent. Signals received from, for example, a convolutional encoder, may be interdependent signals, that is, signals with memory. In this regard, a convolutional encoder may generate NRZI or continuous-phase modulation (CPM), which is generally based on a finite state machine operation.

One method or algorithm for signal detection in a receiver system that decodes convolutional encoded data is maximum-likelihood sequence detection or estimation (MLSE). The MLSE is an algorithm that performs soft decisions while searching for a sequence that minimizes a distance metric in a trellis that characterizes the memory or interdependence of the transmitted signal. In this regard, an operation based on the Viterbi algorithm may be utilized to reduce the number of sequences in the trellis search when new signals are received. Another method or algorithm for signal detection of convolutional encoded data that makes symbol-by-symbol decisions is maximum a posteriori probability (MAP). The optimization of the MAP algorithm is based on minimizing the probability of a symbol error. In many instances, the MAP algorithm may be difficult to implement because of its computational complexity.

In video applications, for example, improvements in the design and implementation of receivers for decoding convolutional encoded video data may require modifications to the application of the MLSE algorithm, the Viterbi algorithm, and/or the MAP algorithm in accordance with the manner in which the signal was transmitted. In this regard, the overall performance of the receiver may therefore depend on the ability of the receiver to optimize the decoding of video content.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for redundancy-based decoding of video content, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for redundancy-based decoding of video content. Aspects of the invention may include a bit sequence comprising video content that may be decoded in a multilayer process based on a decoding algorithm and at least one physical constraint. The decoding algorithm may be based on the Viterbi algorithm. Whether the bit sequence comprises video content may be determined based on information provided by a portion of a packet header or by packet priority information necessary for enabling quality of service applications. The physical constraint may be based on border, DC component, and/or low frequency continuity between neighboring discrete cosine transform (DCT) blocks. The physical constraint may also be based on the consistency of video data coded by a variable length coding (VLC) operation. At least one physical constraint test may be performed on selected estimated video bit sequences to select a decoded output video bit sequence.

Figure 1:
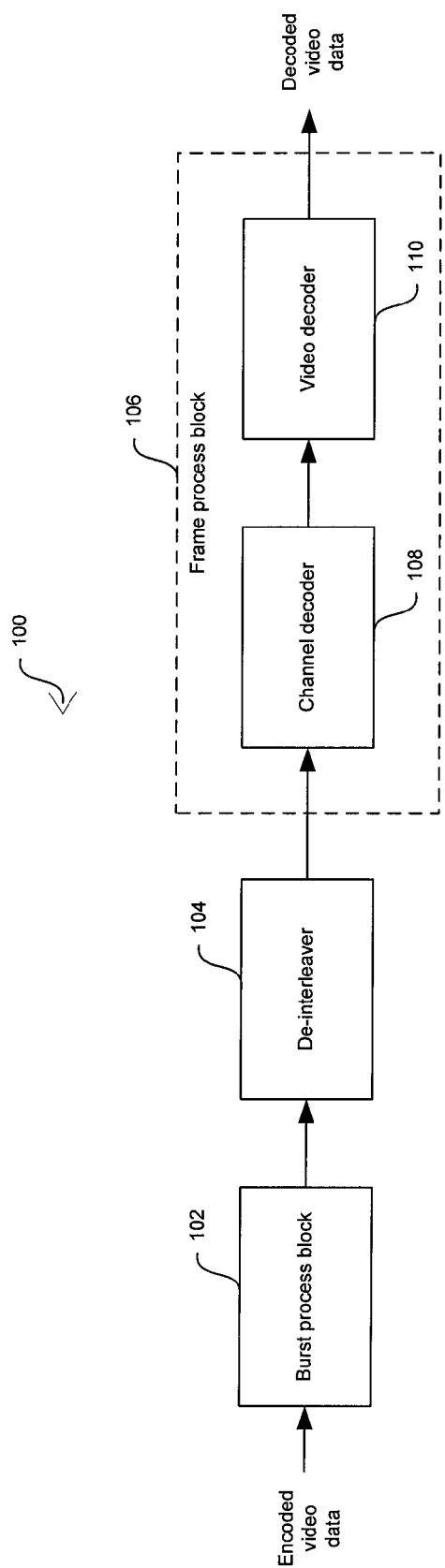
FIG. 1 is a block diagram illustrating a multilayer system for improving video content decoding, in accordance with an embodiment of the invention.

FIG. 1 is a block diagram illustrating a multilayer system for improving video content decoding, in accordance with an embodiment of the invention. Referring to FIG. 1, there is shown a receiver 100 that comprises a burst process block 102, a de-interleaver 104, and a frame process block 106. The frame process block 106 may comprise a channel decoder 108 and a video decoder 110. The receiver 100 may comprise suitable logic, circuitry, and/or code that may enable reception of and processing of signals, such as signals comprising video content, for example. The receiver 100 may support signal received via wired or wireless transmission. The receiver 100 may enable decoding of interdependent signals, such as signals that comprise convolutional encoded data, for example, by utilizing redundancy inherent in the signal that may result from the coding operation. The receiver 100 may also enable a multilayer approach for improving the decoding of interdependent signals or signals with memory. In this regard, the receiver 100 may enable a burst process and a frame process when processing the received interdependent signals. The multilayer approach performed by the receiver 100 may be compatible with a plurality of modulation standards utilized for signal transmission, for example.

The burst process block 102 may comprise suitable logic, circuitry, and/or code that may enable a burst process portion of the decoding operation of the receiver 100. The burst process block 102 may comprise, for example, a channel estimation operation and a channel equalization operation. Results from the channel estimation operation may be utilized by the channel equalization operation to generate a plurality of data bursts based on a maximum-likelihood sequence estimation (MLSE) operation, for example. In video applications, the data bursts generated by the burst process block 102 may correspond to video data bursts, for example. The output of the burst process block 102 may be transferred to the de-interleaver 104. The de-interleaver 104 may comprise suitable logic, circuitry, and/or code that may enable multiplexing of bits from a plurality of data bursts received from the burst process block 102 to form the frame inputs to the frame process block 106. Interleaving may be utilized to reduce the effect of channel fading distortion, for example. In video applications, the frame inputs to the frame process block 106 may correspond to video frame inputs, for example.

The channel decoder 108 may comprise suitable logic, circuitry, and/or code that may enable decoding of the bit sequences in the input frames received from the de-interleaver 104. The channel decoder 108 may enable utilizing a Viterbi algorithm during a Viterbi operation to improve the decoding of the input frames. The video decoder 110 may comprise suitable logic, circuitry, and/or code that may enable video specific processing operations on the results of the channel decoder 108 for specified applications such as MPEG-4, AVC, H.263, or H.264, for example. In this regard, the video decoder 110 may be utilized to reconstruct an encoded video image or an encoded video sequence for display.

Figure 2:
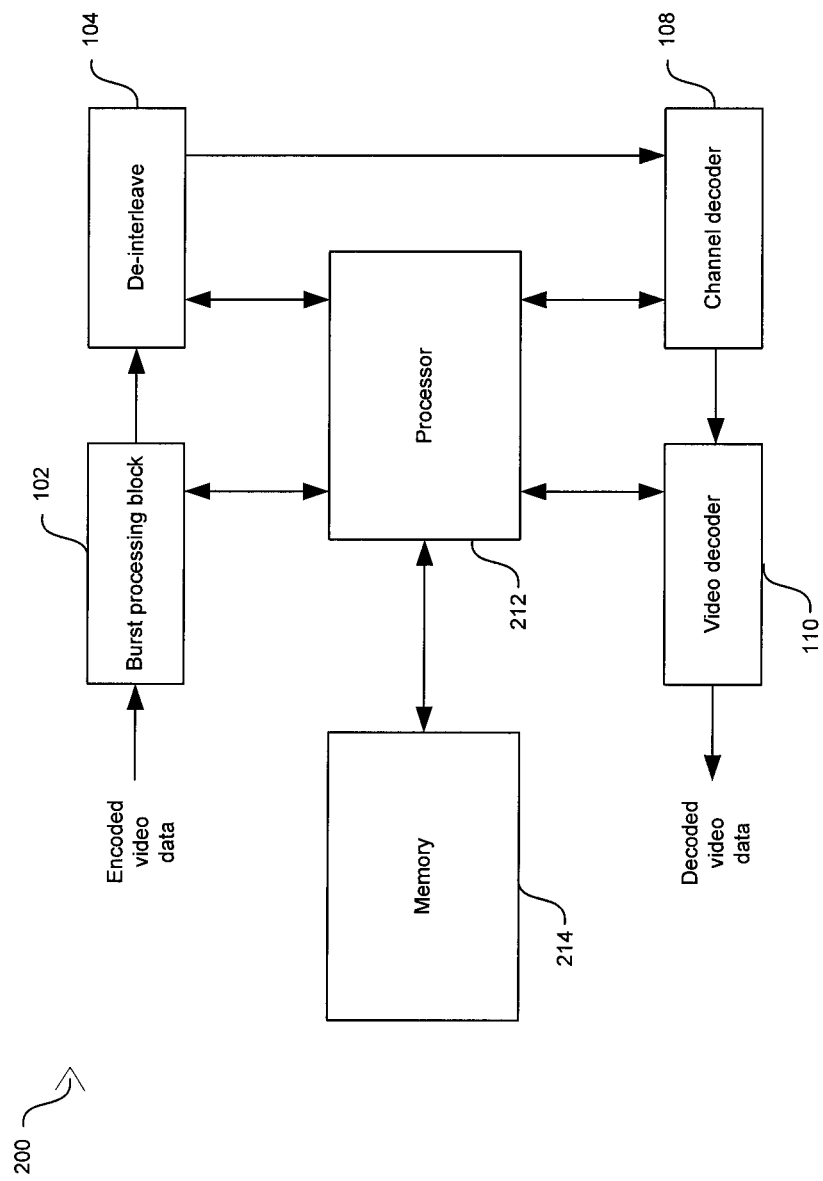
FIG. 2 is a block diagram illustrating a multilayer system with a processor and memory for improving video content decoding, in accordance with an embodiment of the invention.

FIG. 2 is a block diagram illustrating a multilayer system with a processor and memory for improving video content decoding, in accordance with an embodiment of the invention. Referring to FIG. 2, there is shown a receiver system 200 that may comprise a processor 212, a memory 214. The receiver system 200 may also comprise the burst process block 102, a de-interleaver 104, the channel decoder 108 and the video decoder 110 shown in FIG. 1. The processor 212 may comprise suitable logic, circuitry, and/or code that may enable performing of computations and/or management operations. The processor 212 may also enable communication with and/or control of at least a portion of the burst process block 102, the de-interleaver 104, the channel decoder 108 and the video decoder 110. The memory 214 may comprise suitable logic, circuitry, and/or code that may enable storing of data and/or control information. The memory 214 may enable storing of information that may be utilized and/or that may be generated by the burst process block 102, the de-interleaver 104, the channel decoder 108 and the video decoder 110. In this regard, information may be transferred to and from the memory 214 via the processor 212, for example. The processor 212 and the memory 214 may be utilized by the receiver system 200 to enable redundancy-based decoding operations that utilize physical constraints for optimizing the decoding of convolutional encoded data that comprises video content, for example.

Regarding the frame process operation in the receiver 100 in FIG. 1 or in the receiver system 200 in FIG. 2, one approach for decoding convolutional encoded data is to utilize a maximum a posteriori probability (MAP) algorithm. This approach may utilize a priori statistics of the source bits such that a one-dimensional a priori probability, $p(b_i)$, may be generated, where $b_i$ corresponds to a current bit in the bit sequence to be encoded. To determine the MAP sequence, the Viterbi transition matrix calculation may need to be modified. This approach may be difficult to implement in instances where complicated physical constraints and when the correlation between bits $b_i$ and $b_j$, where i and j are far apart, may not be easily determined. In cases where a parameter domain has a high correlation, the MAP algorithm may be difficult to implement. Moreover, the MAP algorithm may not be utilized in cases where inherent redundancy, such as for CRC, is part of the physical constraints.

Regarding the frame process operation in the receiver 100 in FIG. 1 or in the receiver system 200 in FIG. 2, another approach for decoding convolutional encoded data is to find the maximum-likelihood sequence estimate (MLSE) for a bit sequence. This may involve searching for a sequence X in which the conditional probability P(X/R) is a maximum, where X is the transmitted sequence and R is the received sequence, by using, for example, the Viterbi algorithm. In some instances, the received signal R may comprise an inherent redundancy as a result of the encoding process by the signals source. This inherent redundancy may be utilized in the decoding process by developing a MLSE algorithm that may be adapted to meet at least some of the physical constrains of the signals source. The use of physical constraints in the MLSE may be expressed as finding a maximum of the conditional probability P(X/R), where the sequence X meets a set of physical constrains C(X) and the set of physical constrains C(x) may depend on the source type and on the application. In this regard, for video and/or multimedia applications the source type may be a video source.

For certain data formats, for example, the inherent redundancy of the physical constraints may result from the packaging of the data and the generation of a redundancy verification parameter, such as a cyclic redundancy check (CRC), for the packaged data. Moreover, decoding data generated by entropy encoders or variable length coding (VLC) operations may also meet some internal constraints. For example, VLC operations utilize a statistical coding technique where short codewords may be utilized to represent values that occur frequently and long codewords may be utilized to represent values that occur less frequently.

The maximum-likelihood sequence estimate (MLSE) for a bit sequence may be a preferred approach for decoding convolutional encoded data. A general solution for the maximum of the conditional probability $P(X/R)$, where R meets a certain set of physical constraints $C(X)$, for the MLSE may still be difficult to implement. In this regard, an efficient solution may require a suboptimal solution that takes into consideration the complexity and the implementation requirements of utilizing physical constraints in the decoding operation. In video applications, determining the appropriate physical constraints for the video content may be necessary in order to implement an efficient solution for redundancy-based decoding operations.

Figure 3:
FIG. 3 is a diagram illustrating the effects on an image of errors in the decoding of DCT coefficients, which may be utilized in association with an embodiment of the invention.

FIG. 3 is a diagram illustrating the effects on a video image of errors in the decoding of DCT coefficients, which may be utilized in association with an embodiment of the invention. Referring to FIG. 3, there is shown a video image 300 that may comprise plurality of decoding errors that may occur in a reconstructed video image when there is an error in decoding the discrete cosine transform (DCT) coefficients utilized to inverse transform the video image in a video decoder, such as the video decoder 110, for example. Applying a physical constraint to the decoding operation of the DCT coefficients may enable a reduction in decoding errors.

In video applications, where the video information may be partitioned into frames, blocks, and/or macroblocks, typical constraints may comprise, for example, continuity between the borders of DCT blocks, continuity of the DC component between neighboring blocks, continuity of low frequencies between blocks, and/or consistency of data that is coded by a VLC operation. In some instances, the inherent redundancy of the physical constraints in video applications may result from the packaging of the data and the generation of a redundancy verification parameter, such as a cyclic redundancy check (CRC), for the packaged data. The following example illustrates the application of a multilayer solution that efficiently implements physical constraints into the decoding of data frames comprising video content.

Figure 4A:
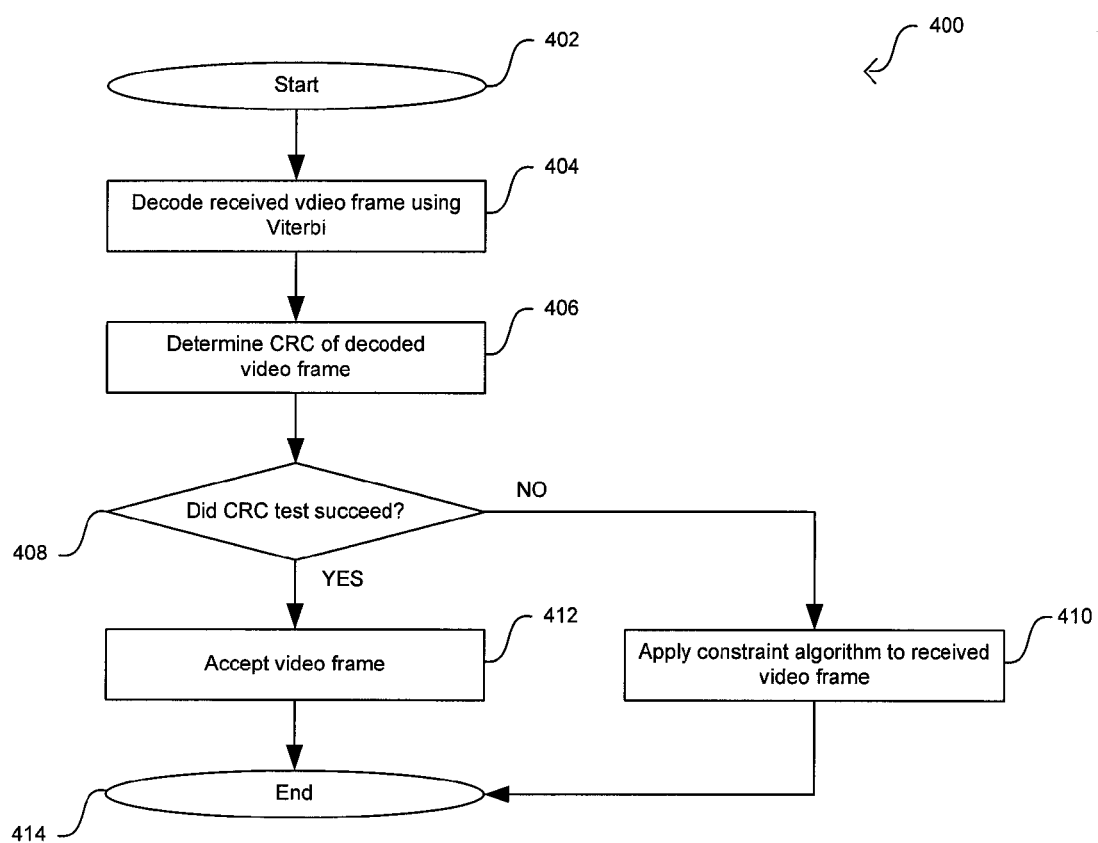
FIG. 4A is a flow diagram illustrating exemplary steps in the application of redundancy to a multilayer process for video content decoding, in accordance with an embodiment of the invention.

FIG. 4A is a flow diagram illustrating exemplary steps in the application of redundancy to a multilayer process for video content decoding, in accordance with an embodiment of the invention. Referring to FIG. 4A, after start step 402, in step 404, a video receiver, such as the receiver 100 in FIG. 1 or the receiver system 200 in FIG. 2, for example, may decode a received video frame in the frame process block 106 by utilizing the Viterbi algorithm. A received video frame may correspond to a bit sequence comprising video content, for example. In step 406, a redundancy verification parameter, such as the CRC, may be determined for the decoded video frame. In step 408, the video receiver may determine whether the CRC verification test was successful. When the CRC verifies the decoded video frame, the operation may proceed to step 412 where the decoded video frame is accepted for further processing, such as application specific video decoding, for example. After step 412, the operation may proceed to end step 414.

Returning to step 408, when the CRC verification test is not successful for the decoded video frame, the process may proceed to step 410. In step 410, the video receiver may perform a redundancy algorithm that may be utilized to provide a decoding performance that may result in equal or reduced decoding errors when reconstructing a video image than those that may occur from utilizing the standard Viterbi algorithm. After step 410, the operation may proceed to end step 414.

For some video applications, for example, the redundancy algorithm may comprise searching for the MLSE that may also meet the CRC condition and the physical constraints. In this regard, a set of k bit sequences $\{S1, S2, \ldots, Sk\}$ may be determined from the MLSE that meet the CRC constraint. Once the set of k sequences is determined, a best sequence, Sb, may be determined that also meets at least one of a plurality of physical constraints associated with a specified video content.

Figure 4B:
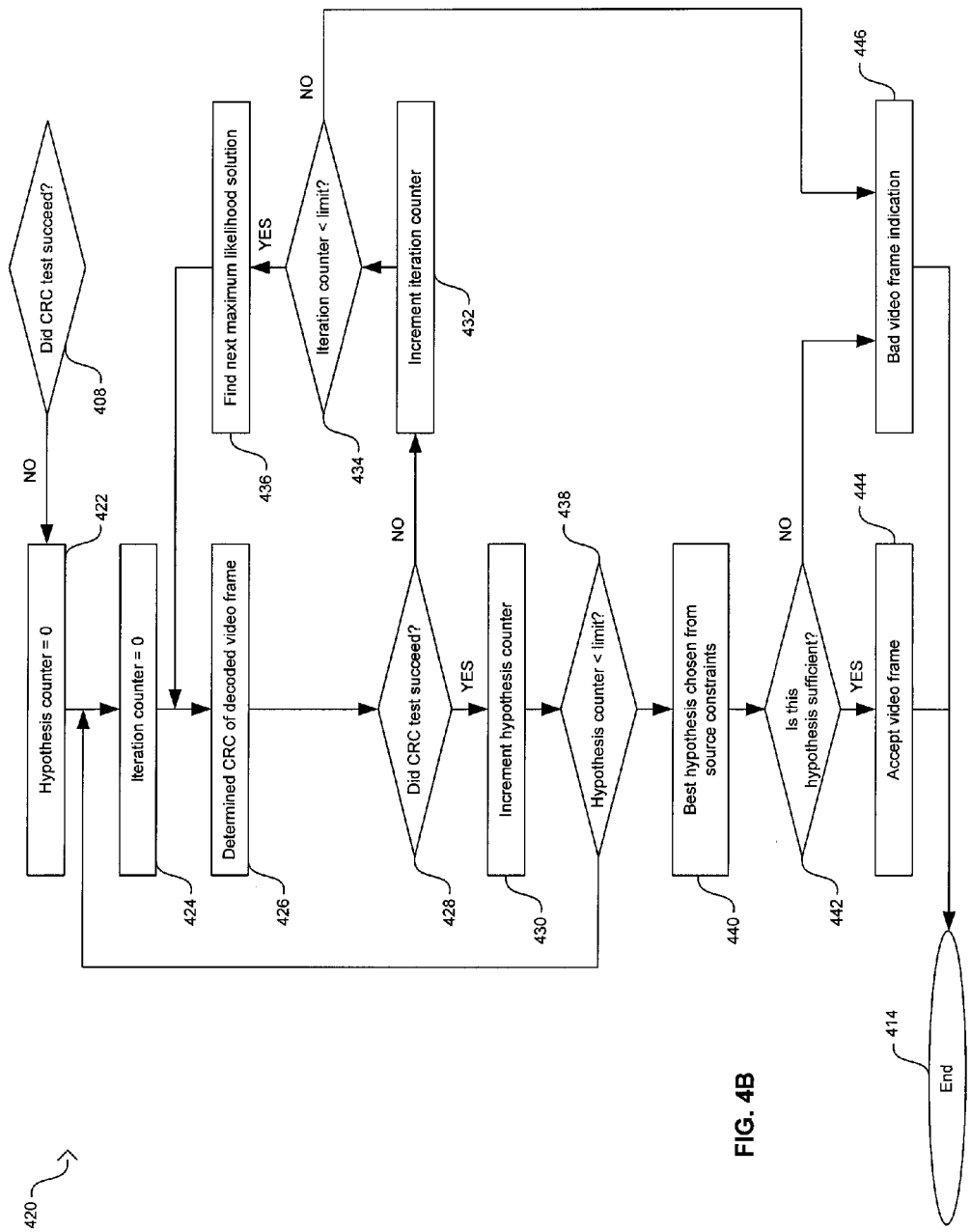
FIG. 4B is a flow diagram illustrating exemplary steps in the application of a constraint algorithm to a received frame for video content decoding, in accordance with an embodiment of the invention.

FIG. 4B is a flow diagram illustrating exemplary steps in the application of a constraint algorithm to a received frame for video content decoding, in accordance with an embodiment of the invention. Referring to FIG. 4B, when the CRC verification test is not successful for the decoded video frame in step 408 in FIG. 4A, the operation may proceed to step 422. In step 422, a hypothesis counter may be set to an initial counter value to indicate a first hypothesis for consideration, for example. The initial counter value in step 422 may be zero, for example. After step 422, an iteration counter may be set to an initial counter value in step 424 to indicate a first maximum likelihood solution, for example. The initial counter value in step 424 may be zero, for example. In step 426, the CRC of the decoded video frame may be determined.

In step 428, the video receiver may determine whether the CRC verification test was successful for the current hypothesis. When the CRC verification test is not successful, the operation may proceed to step 432. In step 432, the iteration counter may be incremented. After step 432, in step 434, the video receiver may determine whether the iteration counter is less than a predetermined limit. When the iteration counter is higher or equal to the predetermined limit, the operation may proceed to step 446 where a bad video frame indication is generated. When the iteration counter is less than the predetermined limit, the operation may proceed to step 436 where a next maximum likelihood solution may be determined. After step 436, the operation may proceed to step 426 where the CRC of the decoded video frame may be determined based on the maximum likelihood solution determined in step 426.

Returning to step 428, when the CRC verification test is successful, the operation may proceed to step 430. In step 430, the hypothesis counter may be incremented. After step 430, in step 438, the video receiver may determine whether the hypothesis counter is less than a predetermined limit. When the hypothesis counter is less than the predetermined limit, the operation may proceed to step 424 where the iteration counter may be set to an initial value. When the hypothesis counter is equal the predetermined limit, the operation may proceed to step 440 where the best hypothesis may be chosen from the source constraints.

After step 440, in step 442, the video receiver may determine whether the best hypothesis chosen in step 440 is sufficient to accept the decoded video frame. When the chosen hypothesis is sufficient to accept the decoded video frame, the operation may proceed to step 444 where the decoded video frame may be accepted. When the chosen hypothesis is not sufficient to accept the decoded frame, the operation may proceed to step 446 where a bad video frame indication is generated. After step 444 or step 446, the operation may proceed to end step 414 in FIG. 4A.

Figure 5A:
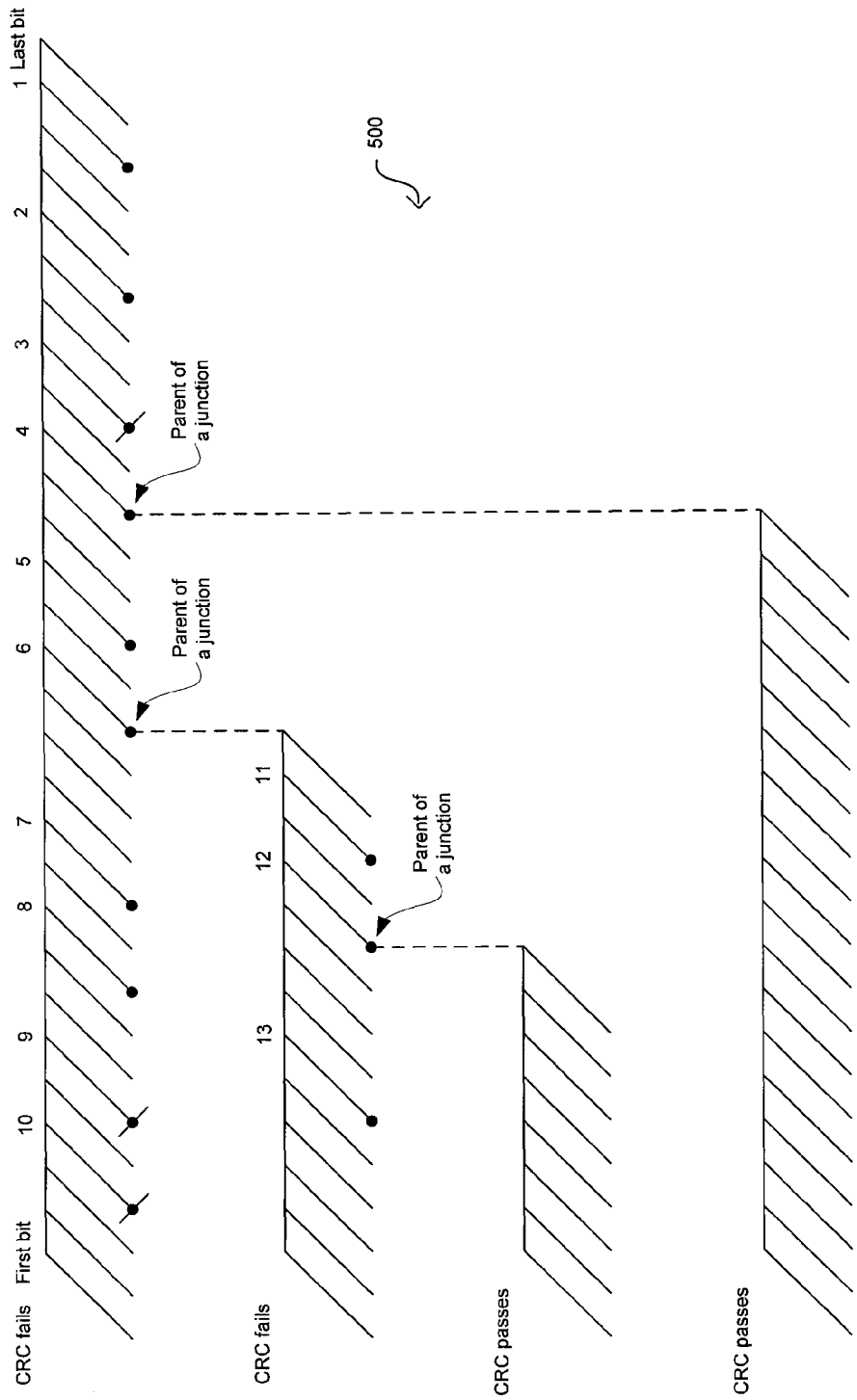
FIG. 5A is diagram illustrating an exemplary search process for a T hypothesis that meets CRC constraint for decoding video content, in accordance with an embodiment of the invention.

FIG. 5A is diagram illustrating an exemplary search process for a T hypothesis that meets CRC constraint for decoding video content, in accordance with an embodiment of the invention. Referring to FIG. 5A, there is shown a search tree 500 that may correspond to an exemplary sequence search process that may start with the reduced set of estimated bit sequences generated by a Viterbi operation. The estimated bit sequence may be generated from at least a portion of a received video frame or bit sequence comprising video content. In this regard, the top horizontal row corresponds to a set of N trellis junctions that may result from the Viterbi operation. The main sequence metric and the metric of main sequence junctions may be obtained during the Viterbi calculation. The metric of other sequences may be obtained from the sum of the parent sequence metric and the junction metric. Each of the trellis junctions is shown as a diagonal line and corresponds to an estimated bit sequence from the Viterbi operation. The estimated bit sequences in the top row do not meet the CRC constraint. In the redundancy algorithm, a set of estimated bit sequences may be selected from those in the top row. As shown, 10 estimated bit sequences may be selected, for example, from the N trellis junctions. The 10 selected estimated bit sequences may be shown as having a dark circle at the end of the diagonal line. In this regard, the selection may depend on a metric parameter, where the metric parameter may, in some instances, comprise a channel metric portion and a physical constraint metric portion.

The search process for a T hypothesis that meets the CRC or redundancy verification parameter for video decoding applications may start with the selected trellis junction with the highest metric. In this example, the junction labeled 6 has the highest metric and the search process may start at that point. A new search tree 500 branch or row may be created from the junction labeled 6 and a trace back pointer may be utilized to track the search operation. The new branch or row results in three additional estimated bit sequences or three junctions labeled 11 through 13. As a result, the three junctions in the top row with the lowest metrics, junctions 3, 9, and 10, may be dropped. This is shown by a small dash across the dark circle at the end of the diagonal line. Again, the new branch or row is verified for CRC. As shown, the CRC fails for this new branch and a next branch may be created from the junction with the highest metric or junction 12 as shown. In this instance, the branch that results from junction 12 meets the CRC constraint and the search process may return to the top row and to the junction with the next highest metric. The estimated bit sequence associated with junction 12 may be selected as one of the bit sequences for the set of k sequences {S1, S2, . . . , Sk}.

Junction 4 represents the next highest metric after junction 6 on the top row and a new branch or row may be created from junction 4. In this instance, the new branch meets the CRC constraint and the estimated bit sequence associated with junction 4 may be selected as one of the bit sequences for the set of k sequences {S1, S2, . . . , Sk}. This approach may be followed until the limit of k sequences is exceeded or the search from all the remaining selected junctions is performed. In this regard, a plurality of trace back pointers may be calculated during the search operation. The size of the set of k bit sequences {S1, S2, . . . , Sk} may vary.

Figure 5B:
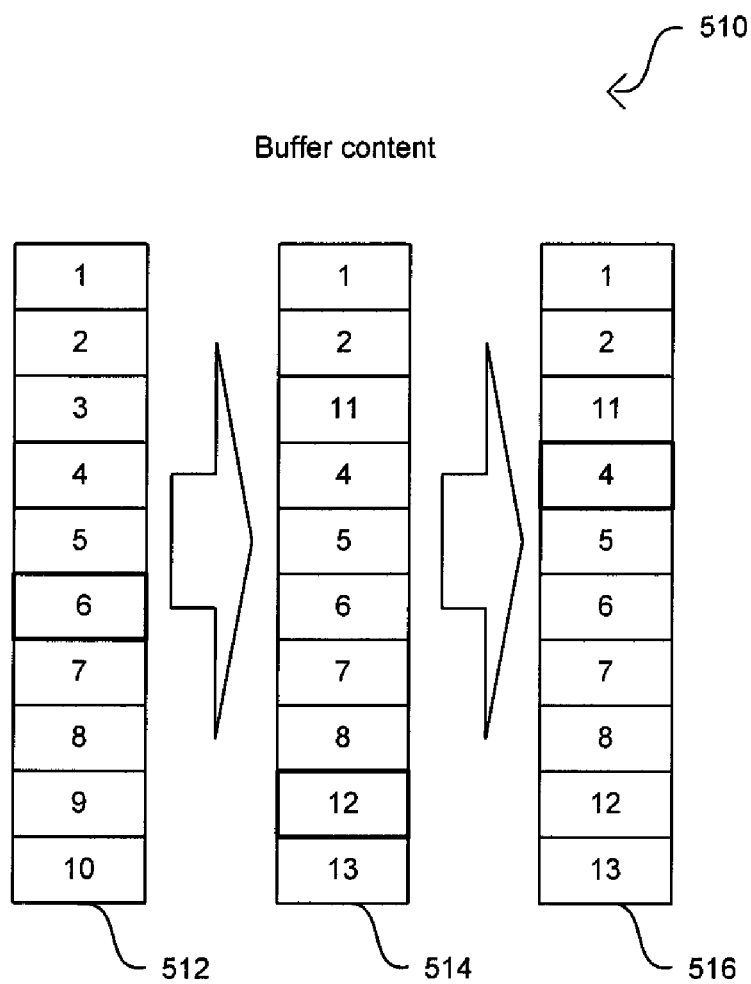
FIG. 5B is a diagram illustrating exemplary buffer content during the search process described in FIG. 5A, in accordance with an embodiment of the invention.

FIG. 5B is a diagram illustrating exemplary buffer content during the search process described in FIG. 5A, in accordance with an embodiment of the invention. Referring to FIG. 5B, there is shown a buffer content 510 that may correspond to the junction labels under consideration during the search process. For example, state 512 may correspond to the initial 10 junctions in the search operation. In this regard, junction 6 is highlighted to indicate that it corresponds to the highest metric value and is the starting point of a new branch or row. The state 514 may correspond to the next set of 10 junctions. In this instance, junctions 3, 9, and 10 have been replaced with junctions 11, 12, and 13 that resulted from the branch created from junction 6. Junction 12 is highlighted to indicate that is corresponds to the highest metric value and is the starting point of a new branch or row. The state 516 may correspond to the next set of 10 junctions. In this instance, junction 4 is highlighted to indicate that is corresponds to the highest metric value and is the starting point of a new branch or row. Trace back pointers may be calculated at each state to track the search process.

Figure 5C:
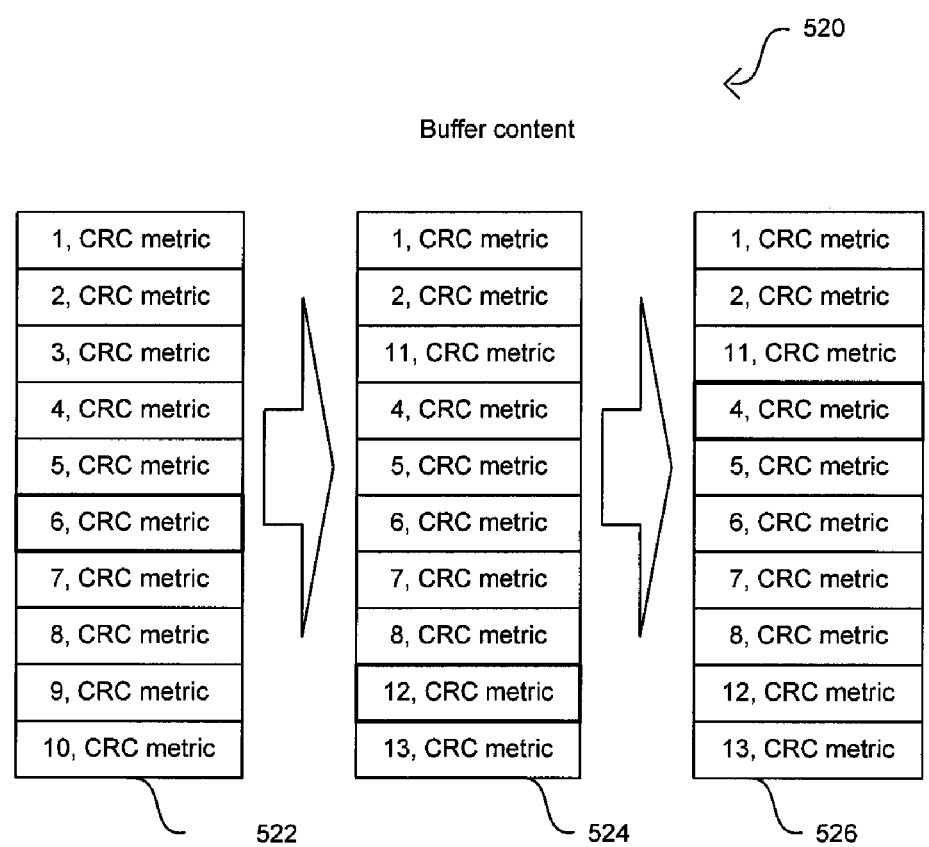
FIG. 5C is a diagram illustrating exemplary buffer content when CRC and trace back pointers are calculated simultaneously during the search process described in FIG. 5A, in accordance with an embodiment of the invention.

FIG. 5C is a diagram illustrating exemplary buffer content when CRC and trace back pointers are calculated simultaneously during the search process described in FIG. 5A, in accordance with an embodiment of the invention. Referring to FIG. 5C, there is shown a buffer content 520 that may correspond to the junction labels under consideration during the search process and the corresponding CRC calculations, for example. As with FIG. 5B, the buffer content 520 may vary its contents based on a current state. For state 522, state 524, and state 526, the contents that correspond to the current junctions under consideration are the same as in state 512, state 514, and state 516 in FIG. 5B respectively. However, in order to simplify the search process for T hypothesis, the CRC and the trace back pointers for the states may be calculated simultaneously. This approach is possible because the CRC may be calculated as sum($b_i R_i$), where $R_i$ is the remainder of xi/g(x), where g(x) is the generator polynomial of the CRC, and $b_i$ is the value of the bit i. The CRC metric of each sequence may be kept or stored in the buffer content 520. The CRC metric may be obtained as the sum of the biRi values from the junction to the last bit, and may also be determined as the sum of the parent sequence CRC metric and sum of the biRi values from junction to its parent. The sequence may meet the CRC condition if the CRC metric is equal to the sum of the biRi values from first bit to the junction. The values for $R_i$ may be stored in, for example, a look up table.

Once the set of k sequences {S1, S2, . . . , Sk} has been determined by following the search as described in FIGS. 5A-5C, the redundancy algorithm may require that the video receiver, such as the receiver 100 in FIG. 1 or the receiver system 200 in FIG. 2, for example, selects one of the bit sequences as the best bit sequence, Sb, that meets the CRC constrain and the physical constrains with the highest level of confidentiality. The best bit sequence may also be referred to as the decoded output bit sequence of the multilayer process.

For each of the candidate bit sequences in the set of k bit sequences {S1, S2, . . . , Sk}, a set of T1 different physical constraint tests, {Test(j), . . . , Test(T1)}, may be performed. The physical constraint tests correspond to tests of quantifiable characteristics of the type of video data received for a particular video application, for example. The scores of the physical constraint tests for an $i^{th}$ bit sequence, {T_SC(i, j), . . . , T_SC(i, T1)}, may be utilized to determine whether the bit sequence passed or failed a particular test. For example, when T_SC(i, j)>0, the $i^{th}$ bit sequence is said to have failed the $j^{th}$ physical constraint test. When the T_SC(i, j)<=0, the $i^{th}$ bit sequence is said to have passed the $j^{th}$ physical constraint test. In some instances, when the value of a test score is smaller, the reliability of the score may be increased.

Once the physical constraint tests are applied to the candidate estimated bit sequences, the following exemplary approach may be followed: when a score is positive, the candidate bit sequence may be rejected; for a particular physical constraint test, the candidate with the best score or with the lowest score value may be found; the candidate that is selected as the best score for the most number of tests may be selected as the best bit sequence, Sb.

TABLE 1

| Candidate | Test (1) | Test (2) | Test (3) | Test (4) |
|---|---|---|---|---|
| S1 | Score(1, 1) < 0 | Score(1, 2) < 0 | Score(1, 3) < 0 | Score(1, 4) < 0 |
| S2 | Score(2, 1) < 0 | Score(2, 2) > 0 | Score(2, 3) < 0 | Score(2, 4) < 0 |
| S3 | Score(3, 1) < 0 | Score(3, 2) < 0 | Score(3, 3) < 0 | Score(3, 4) < 0 |
| S4 | Score(4, 1) < 0 | Score(4, 2) < 0 | Score(4, 3) < 0 | Score(4, 4) > 0 |
| S5 | Score(5, 1) < 0 | Score(5, 2) < 0 | Score(5, 3) < 0 | Score(5, 4) < 0 |
| Minimum score sequence | S3 | S5 | S3 | S3 |

Table 1 illustrates an exemplary embodiment of the invention in which a set of five candidate bit sequences, {S1, S2, S3, S4, and S5}, may be tested using a set of four physical constraint tests, {Test(1), Test(2), Test(3), and Test(4)}. The scores may be tabulated to identify passing and failing of various tests for each of the candidate bit sequences. In this instance, S2 and S4 are rejected for having positive scores for Test(2) and Test(4) respectively. The bit sequence S3 is shown to have the lowest score in Test(1), Test(3), and Test(4) and may be selected as the best bit sequence, Sb.

Some characteristic physical constraint tests that may be utilized in video applications may be continuity between the borders of DCT blocks, continuity of the DC component between neighboring blocks, continuity of low frequencies between blocks, and/or consistency of data that is coded by a VLC operation. For example, regarding the use of the DC component as a physical constraint test, the criteria may be smoothness or consistency between neighboring blocks. Regarding the use of low spatial frequency components, the criteria may be the continuity between neighboring blocks, for example.

Figure 6:
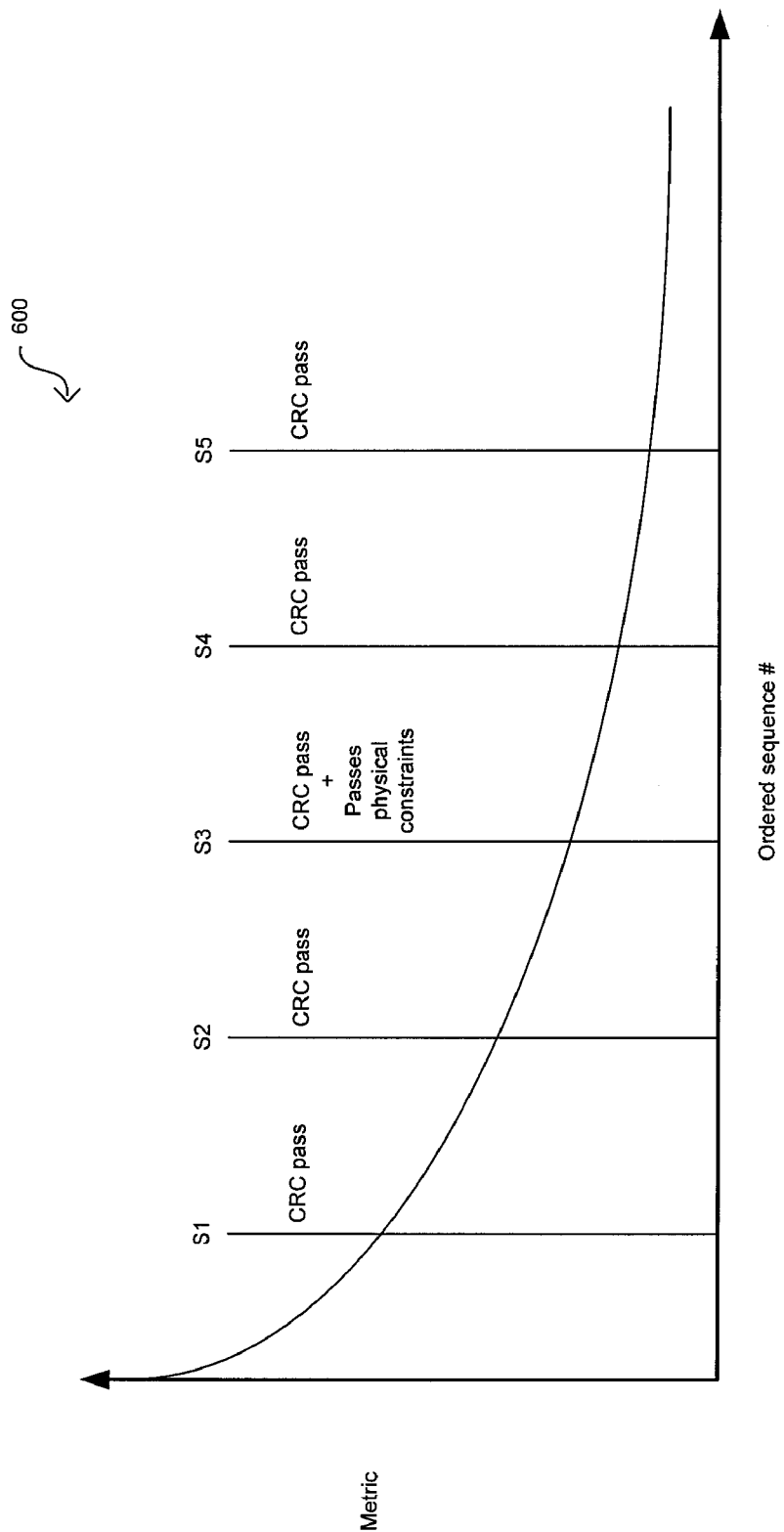
FIG. 6 is a graph illustrating exemplary set of sequences that meets CRC and video constraints, in accordance with an embodiment of the invention.

FIG. 6 is a graph illustrating exemplary set of sequences that meets CRC and speech constraints, in accordance with an embodiment of the invention. Referring to FIG. 6, there is shown the result of the redundancy algorithm. For example, the search process for T hypothesis as shown in FIGS. 5A-5C may result in the set of bit sequences {S1, S2, S3, S4, and S5} associated with the decoding of a received video frame or bit sequence comprising video content. These bit sequences may be selected based on their metric values and passing the CRC verification. The set of bit sequences may also be required to pass physical constraint tests associated with the encoded video content as described herein. In this instance, the bit sequence S3 has been shown to meet the CRC verification and the physical constraint test and may be selected as the best bit sequence, Sb.

Figure 7:
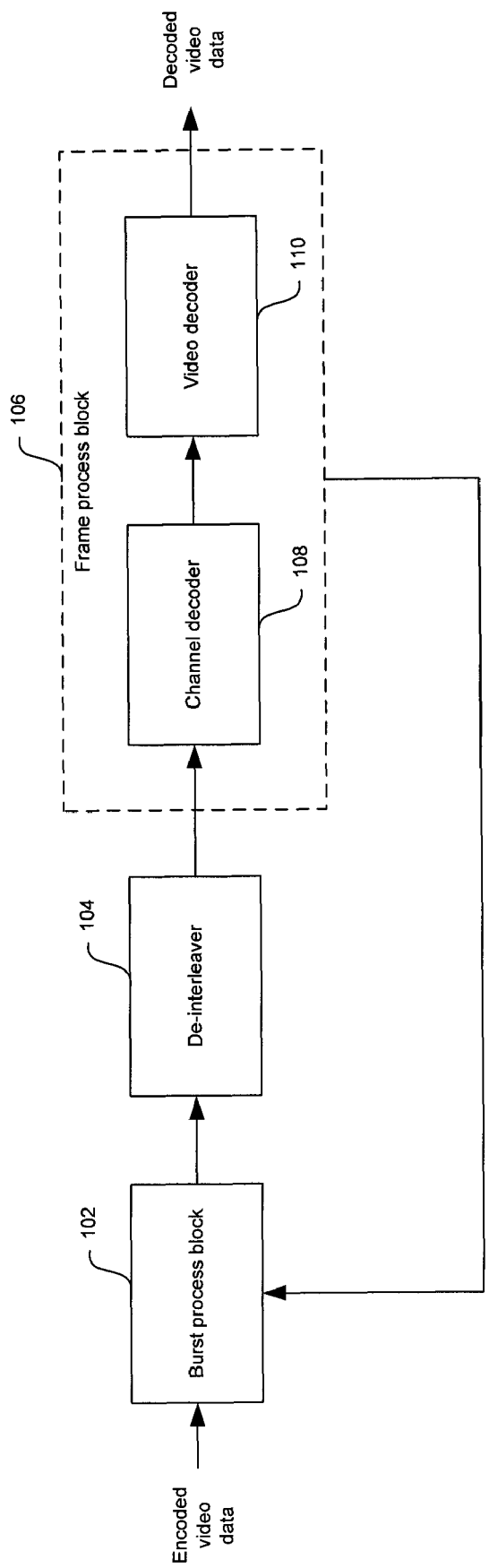
FIG. 7 is a block diagram illustrating an iterative multilayer approach for improving video content decoding, in accordance with an embodiment of the invention.

FIG. 7 is a block diagram illustrating an iterative multilayer approach for improving video content decoding, in accordance with an embodiment of the invention. Referring to FIG. 7, there is shown the receiver 100 in FIG. 1 with a feedback signal from the frame process portion of the multilayer decoding approach to the burst process portion of the multilayer decoding approach. The frame process may comprise the use of redundancy verification of the results generated by the Viterbi algorithm and the use of physical constraints to reduce decoding errors in decoded video images that may result from utilizing the standard Viterbi algorithm. The burst process may utilize information decoded in the frame process block 106 as an input to improve the channel estimation and channel equalization operations in the burst process block 102.

Figure 8:
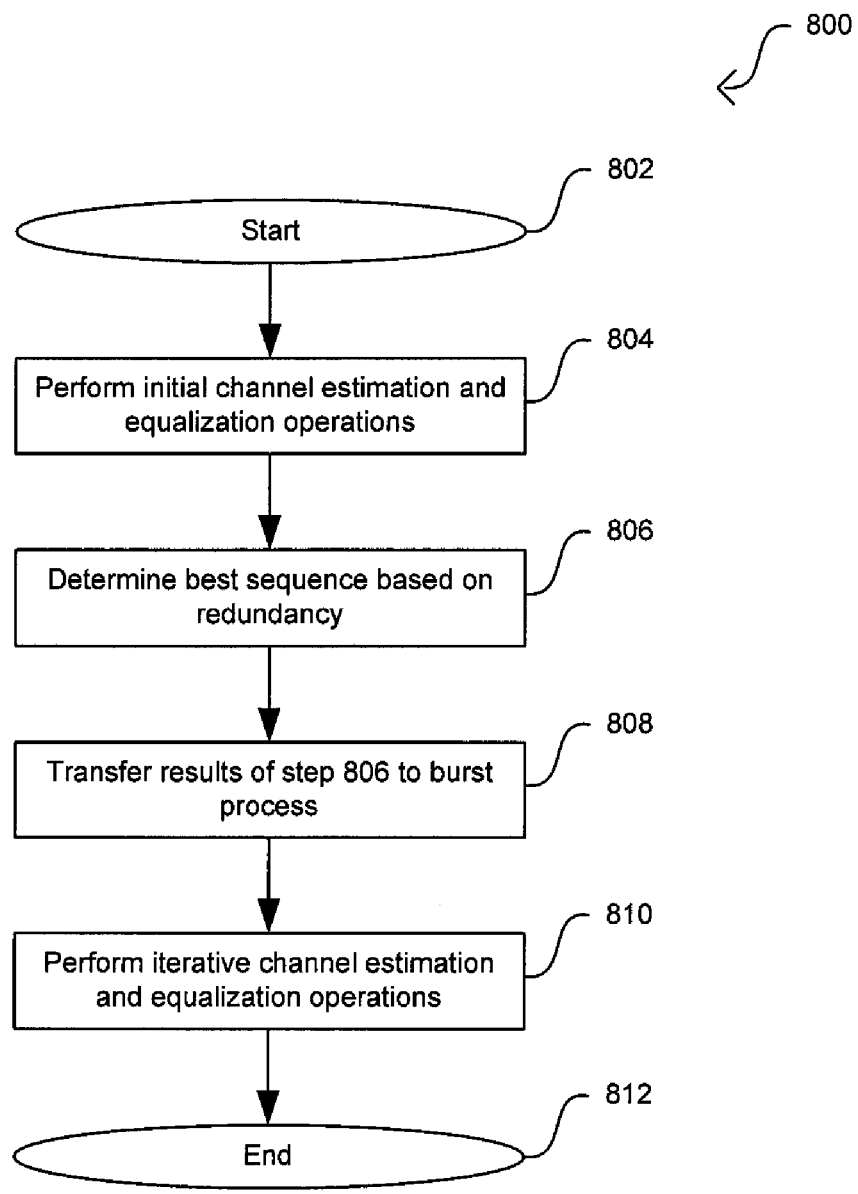
FIG. 8 is a flow diagram illustrating exemplary steps in the iterative multilayer approach for improving video content decoding, in accordance with an embodiment of the invention.

FIG. 8 is a flow diagram illustrating exemplary steps in the iterative multilayer approach for improving video content decoding, in accordance with an embodiment of the invention. Referring to FIG. 8, after start step 802, in step 804, an initial or first iteration of a channel estimation operation and of an equalization operation may be performed on received video signals during a burst process portion of the multilayer decoding approach. The first iteration of the channel estimation operation and the first iteration of the equalization operation may be performed by, for example, the burst process block 102 in FIG. 7. In step 806, decoding of a received video frame may be performed during the frame processing portion of the multilayer decoding approach. The frame processing may be performed by, for example, the frame process block 106 in FIG. 7. The frame processing may be based on results from the burst processing in step 804. In step 808, at least a portion of the results generated in step 806 by the frame process portion of the multilayer decoding approach may be transferred from, for example, the frame process block 106 to the burst process block 102 via a feedback signal. In step 810, the burst processing may perform a second iteration of the channel estimation operation and/or a second iteration of the equalization operation based on the decoded results provided from the frame process portion of the multilayer decoding approach. After step 810, the operation may proceed to end step 812. The improved results of the burst process may be further interleaved and subsequently processed by the frame process. The frame process may utilize a standard frame process or determine the best sequence that may be utilized based on, for example, redundancy in the video content. The iterative multilayer approach described in FIG. 8 may be utilized in video applications such as digital video broadcasting (DVB), for example.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
in a video processing device,
generating a corresponding redundancy verification parameter for a decoded bit sequence that comprises video content;
verifying said decoded bit sequence based on said corresponding redundancy verification parameter; and
if said decoded bit sequence fails said verification, subsequently decoding said bit sequence previously decoded by imposing at least one physical constraint resulting from encoding of said video content.

2. The method according to claim 1, comprising determining, in said video processing device, whether said decoded bit sequence comprises video content based on at least one flag in a packet comprising said decoded video bit sequence.

3. The method according to claim 1, wherein said at least one physical constraint comprises a border continuity between discrete cosine transform (DCT) blocks.

4. The method according to claim 1, wherein said at least one physical constraint comprises a DC component continuity between neighboring discrete cosine transform (DCT) blocks.

5. The method according to claim 1, wherein said at least one physical constraint comprises a continuity of low frequencies between discrete cosine transform (DCT) blocks.

6. The method according to claim 1, wherein said at least one physical constraint comprises a consistency of data coded by a variable length coding (VLC) operation.

7. The method according to claim 1, comprising determining, in said video processing device, said at least one physical constraint when said decoded bit sequence comprises video content.

8. A non-transitory machine-readable storage having stored thereon, a computer program having at least one code section for signal processing, the at least one code section being executable by a machine for causing the machine to perform steps comprising:
generating a corresponding redundancy verification parameter for a decoded bit sequence that comprises video content;
verifying said decoded bit sequence based on said corresponding redundancy verification parameter; and
if said decoded bit sequence fails said verification, subsequently decoding said bit sequence previously decoded by imposing at least one physical constraint resulting from encoding of said video content.

9. The non-transitory machine-readable storage according to claim 8, comprising code for determining whether said decoded bit sequence comprises video content based on at least one flag in a packet comprising said decoded video bit sequence.

10. The non-transitory machine-readable storage according to claim 8, wherein said at least one physical constraint comprises a border continuity between discrete cosine transform (DCT) blocks.

11. The non-transitory machine-readable storage according to claim 8, wherein said at least one physical constraint comprises a DC component continuity between neighboring discrete cosine transform (DCT) blocks.

12. The non-transitory machine-readable storage according to claim 8, wherein said at least one physical constraint comprises a continuity of low frequencies between discrete cosine transform (DCT) blocks.

13. The non-transitory machine-readable storage according to claim 8, wherein said at least one physical constraint comprises a consistency of data coded by a variable length coding (VLC) operation.

14. The non-transitory machine-readable storage according to claim 8, comprising code for determining said at least one physical constraint when said decoded bit sequence comprises video content.

15. A system for signal processing, the system comprising:
at least one processor that enables generating a corresponding redundancy verification parameter for a decoded bit sequence that comprises video content;
said at least one processor enables verifying said decoded bit sequence based on said corresponding redundancy verification parameter; and
if said decoded bit sequence fails said verification, said at least one processor enables subsequently decoding said bit sequence previously decoded by imposing at least one physical constraint resulting from encoding of said video content.

16. The system according to claim 15, said at least one processor enables determining whether said decoded bit sequence comprises video content based on at least one flag in a packet comprising said decoded video bit sequence.

17. The system according to claim 15, wherein said at least one physical constraint comprises a border continuity between discrete cosine transform (DCT) blocks.

18. The system according to claim 15, wherein said at least one physical constraint comprises a DC component continuity between neighboring discrete cosine transform (DCT) blocks.

19. The system according to claim 15, wherein said at least one physical constraint comprises a continuity of low frequencies between discrete cosine transform (OCT) blocks.

20. The system according to claim 15, wherein said at least one physical constraint comprises a consistency of data coded by a variable length coding (VLC) operation.

21. The system according to claim 15, said at least one processor enables determining said at least one physical constraint when said decoded bit sequence comprises video content.

* * * * *